(12) United States Patent
Cain

(10) Patent No.: US 11,139,115 B2
(45) Date of Patent: Oct. 5, 2021

(54) SURFACE MOUNT MULTILAYER COUPLING CAPACITOR AND CIRCUIT BOARD CONTAINING THE SAME

(71) Applicant: AVX Corporation, Fountain Inn, SC (US)

(72) Inventor: Jeffrey Cain, Greenville, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 16/887,699

(22) Filed: May 29, 2020

(65) Prior Publication Data

US 2020/0303127 A1 Sep. 24, 2020

Related U.S. Application Data

(63) Continuation of application No. 16/021,242, filed on Jun. 28, 2018, now Pat. No. 10,672,563.

(Continued)

(51) Int. Cl.
*H01G 4/30* (2006.01)
*H05K 1/18* (2006.01)
(Continued)

(52) U.S. Cl.
CPC .............. *H01G 4/30* (2013.01); *H01G 4/0085* (2013.01); *H01G 4/228* (2013.01); *H01G 4/232* (2013.01); *H01G 4/2325* (2013.01); *H05K 1/181* (2013.01); *H01G 4/1218* (2013.01); *H05K 2201/10015* (2013.01); *H05K 2201/10378* (2013.01); *H05K 2201/10515* (2013.01); *H05K 2201/10522* (2013.01); *H05K 2201/10734* (2013.01)

(58) Field of Classification Search
CPC ........ H01G 4/30; H01G 4/228; H01G 4/0085; H01G 4/2325; H01G 4/232; H01G 4/1218; H05K 1/181; H05K 2201/10015; H05K 2201/10515; H05K 2201/10522; H05K 2201/10734; H05K 2201/10378; Y10T 29/435

See application file for complete search history.

(56) References Cited

U.S. PATENT DOCUMENTS 4,831,494 A 5/1989 Arnold et al.
5,583,738 A * 12/1996 Kohno .................. H01G 4/385
361/312

(Continued)

FOREIGN PATENT DOCUMENTS

JP 2008022017 1/2008

OTHER PUBLICATIONS

International Search Report and Written Opinion for PCT/US2018/039037 dated Nov. 6, 2018, 15 pages.

*Primary Examiner* — Steven T Sawyer
(74) *Attorney, Agent, or Firm* — Dority & Manning, P.A.

(57) ABSTRACT

The present invention is directed to a surface mount coupling capacitor and a circuit board containing a surface mount coupling capacitor. The coupling capacitor includes a main body containing at least two sets of alternating dielectric layers and internal electrode layers. The coupling capacitor includes external terminals electrically connected to the internal electrode layers wherein the external terminals are formed on a top surface of the coupling capacitor and a bottom surface of the coupling capacitor opposing the top surface of the coupling capacitor.

20 Claims, 2 Drawing Sheets

Related U.S. Application Data

(60) Provisional application No. 62/526,744, filed on Jun. 29, 2017.

(51) Int. Cl.
  *H01G 4/228* (2006.01)
  *H01G 4/232* (2006.01)
  *H01G 4/008* (2006.01)
  H01G 4/12 (2006.01)

(56) References Cited

U.S. PATENT DOCUMENTS

| | | |
|---|---|---|
| 6,243,253 B1 | 6/2001 | DuPre et al. |
| 6,292,351 B1 | 9/2001 | Ahiko et al. |
| 6,757,152 B2 | 6/2004 | Galvagni et al. |
| 6,795,294 B2 | 9/2004 | Kuroda et al. |
| 6,950,300 B2 | 9/2005 | Sutardja |
| 7,177,137 B2 | 2/2007 | Ritter et al. |
| 7,310,217 B2 | 12/2007 | Takashima et al. |
| 7,317,622 B2 | 1/2008 | Li |
| 7,463,474 B2 | 12/2008 | Ritter et al. |
| 7,545,623 B2 | 6/2009 | Randall et al. |
| 7,633,739 B2 | 12/2009 | Devoe |
| 2004/0042156 A1 | 3/2004 | Devoe et al. |
| 2004/0124511 A1 | 7/2004 | Li |
| 2004/0125580 A1 | 7/2004 | Chung et al. |
| 2004/0136141 A1 | 7/2004 | Korony et al. |
| 2004/0223289 A1 | 11/2004 | Kuroda et al. |
| 2005/0046536 A1 | 3/2005 | Ritter et al. |
| 2007/0035014 A1 | 2/2007 | Fung |
| 2007/0165361 A1 | 7/2007 | Randall et al. |
| 2007/0188975 A1 | 8/2007 | Togashi et al. |
| 2008/0049377 A1 | 2/2008 | Sutardja |
| 2008/0123247 A1 | 5/2008 | Randall et al. |
| 2008/0174934 A1 | 7/2008 | Togashi |
| 2009/0002921 A1 | 1/2009 | Ritter et al. |
| 2009/0201624 A1 | 8/2009 | Hattori et al. |
| 2009/0284897 A1 | 11/2009 | Itamura |
| 2010/0039749 A1 | 2/2010 | Ritter et al. |
| 2011/0080683 A1 | 4/2011 | Jones et al. |
| 2011/0250791 A1 | 10/2011 | Straka et al. |
| 2014/0252544 A1 | 9/2014 | Li et al. |
| 2015/0014037 A1 | 1/2015 | Ahn et al. |
| 2015/0022946 A1* | 1/2015 | Park ............ H01G 4/012 361/301.4 |
| 2015/0243438 A1 | 8/2015 | Ahn et al. |
| 2015/0243440 A1 | 8/2015 | Gong et al. |
| 2015/0294791 A1 | 10/2015 | Hwang et al. |
| 2015/0348711 A1 | 12/2015 | Kim et al. |
| 2016/0027582 A1 | 1/2016 | Ahn et al. |
| 2016/0351504 A1 | 12/2016 | Teshima et al. |
| 2016/0381802 A1 | 12/2016 | Taniguchi et al. |
| 2017/0047168 A1 | 2/2017 | Lee et al. |
| 2018/0330880 A1 | 11/2018 | Cain |
| 2018/0330881 A1 | 11/2018 | Cain |

* cited by examiner

SURFACE MOUNT MULTILAYER COUPLING CAPACITOR AND CIRCUIT BOARD CONTAINING THE SAME

CROSS REFERENCE TO RELATED APPLICATIONS

The present application is a continuation application of U.S. patent application Ser. No. 16/021,242 having a filing date of Jun. 28, 2018, which claims filing benefit of U.S. Provisional Patent Application Ser. No. 62/526,744 having a filing date of Jun. 29, 2017, both of which are incorporated herein by reference in their entirety.

BACKGROUND OF THE SUBJECT MATTER

Multilayer coupling capacitors are generally constructed having a plurality of dielectric layers and internal electrode layers arranged in a stack. During manufacture, the stacked dielectric layers and internal electrode layers are pressed and sintered to achieve a substantially unitary capacitor body. In an attempt to improve upon the performance of these capacitors, various configurations and designs have been employed for the dielectric layers and the internal electrode layers.

However, as rapid changes occur in the electronics industry requiring new performance criteria, these configurations are commonly manipulated. In particular, various application design considerations have created a need to redefine the capacitor parameters and its performance in high-speed environments, especially in light of faster and denser integrated circuits. For instance, larger currents, denser circuit boards and spiraling costs have all served to focus upon the need for better and more efficient capacitors. Additionally, the design of various electronic components has been driven by a general industry trend toward miniaturization, as well as increased functionality.

In such regard, a need exists for providing a coupling capacitor with improved operational characteristics. Additionally, some applications would also benefit from providing a coupling capacitor that may have a smaller footprint on a circuit board.

SUMMARY OF THE SUBJECT MATTER

In accordance with one embodiment of the present invention, a surface mount coupling capacitor is disclosed. The coupling capacitor comprises a main body containing a first set of alternating dielectric layers and internal electrode layers and a second set of alternating dielectric layers and internal electrode layers. Each set of alternating dielectric layers and internal electrode layers contains a first internal electrode layer and a second internal electrode layer. Each internal electrode layer includes a top edge, a bottom edge opposite the top edge, and two side edges extending between the top edge and the bottom edge that define a main body of the internal electrode layer. The coupling capacitor includes external terminals electrically connected to the internal electrode layers wherein the external terminals are formed on a top surface of the coupling capacitor and a bottom surface of the coupling capacitor opposing the top surface of the coupling capacitor. The capacitor exhibits an insertion loss of 0.25 dB or less.

In accordance with another embodiment of the present invention, a circuit board comprising a surface mount coupling capacitor is disclosed. The surface mount coupling capacitor comprises a main body containing a first set of alternating dielectric layers and internal electrode layers and a second set of alternating dielectric layers and internal electrode layers. The coupling capacitor further comprises external terminals on a top surface of the coupling capacitor and a bottom surface of the coupling capacitor opposing the top surface of the coupling capacitor. The external terminals on the top surface or the bottom surface of the coupling capacitor opposing the top surface are electrically connected to a surface of the circuit board.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

DETAILED DESCRIPTION OF THE SUBJECT MATTER

It is to be understood by one of ordinary skill in the art that the present discussion is a description of exemplary embodiments only, and is not intended as limiting the broader aspects of the present invention.

Generally speaking, the present invention is directed to a surface mount multilayer coupling capacitor, for example for mounting onto a circuit board. The surface mount multilayer coupling capacitor contains a plurality of capacitive elements within a main body. That is, the multilayer coupling capacitor contains the plurality of capacitive elements within a single, unitary package. In this regard, the multilayer coupling capacitor contains a first set of alternating dielectric layers and internal electrode layers and a second set of alternating dielectric layers and internal electrode layers. Each set of alternating dielectric layers and internal electrode layers defines a capacitive element.

The particular arrangement of the capacitive elements within a single, unitary package (i.e., single body) can provide several advantages. For instance, as discussed further below, the coupling capacitor of the present invention may be mounted onto a circuit board as a surface mount capacitor and may provide a smaller footprint on the circuit board. This may in turn also allow for a reduction in size of a circuit board.

Figure 2:
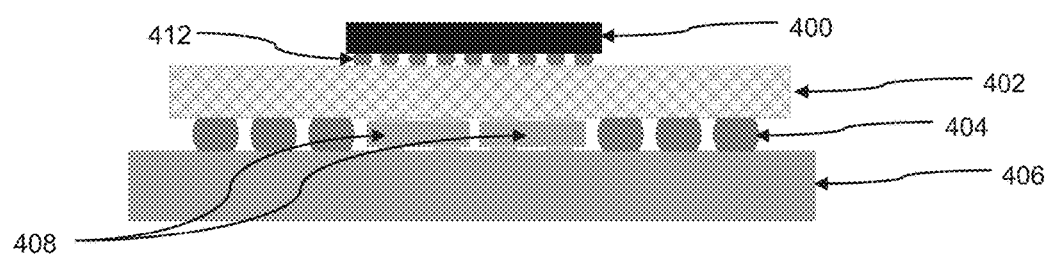
FIG. 2 illustrates side view of a circuit board and integrated circuit package containing a packaged coupling capacitor of the present invention.

Turning to FIG. 2, the coupling capacitors 408 can be mounted (e.g., surface mounted) onto a circuit board 406 that contains a substrate (e.g., insulating layer) having an upper surface and a lower surface. The circuit board 406 has a plurality of electrical current paths (not shown) defined therein. The external terminals of the coupling capacitors 408 are in respective electrical communication with the predetermined current paths of the circuit board 406. In addition, the external terminals of the coupling capacitors 408 can be physically connected to the circuit board 406 using any method generally known in the art, such as general soldering techniques.

As illustrated in FIG. 2, an integrated circuit package 402 may also be provided on the circuit board 406. The integrated circuit package 402 may be connected to the circuit board 406 using a ball grid array 404. The circuit board may further comprise a processor 400. The processor 400 may be connected to the integrated circuit package 402 also using a ball grid array 412.

In general, the ball grid array 404 may be configured to have a certain pitch. As generally known in the art, a pitch refers to a nominal distance between the centers (also referred to as center-to-center spacing). The pitch of the ball grid array 404 and the external terminals of the coupling capacitor 408 may be dictated by the particular circuit board configuration. The pitch between external terminals in one direction (i.e., x or y direction) may be the same as the pitch between adjacent external terminals in the other direction (i.e., y or x direction, respectively). That is, the pitch between any two adjacent external terminals may be substantially the same as the pitch between any other two adjacent external terminals.

The pitch may be about 0.1 mm or greater, such as about 0.2 mm or greater, such as about 0.3 mm or greater, such as about 0.4 mm or greater, such as about 0.5 mm or greater, such as about 0.6 mm or greater, such as about 0.7 mm or greater, such as about 0.8 mm or greater, such as about 0.9 mm or greater, such as about 1.0 m or greater. The pitch may be about 2.0 mm or less, such as about 1.5 mm or less, such as about 1.4 mm or less, such as about 1.3 mm or less, such as about 1.2 mm or less, such as about 1.1 mm or less, such as about 1.0 mm or less. For instance, the pitch may be about 0.2 mm, about 0.4 mm, about 0.6 mm, about 0.8 mm, about 1.0 mm, about 1.2 mm, etc. In particular, the pitch may be 0.6 mm, 0.8 mm, or 1.0 mm. In one embodiment, the pitch may be about 0.6 mm, such as 0.6 mm+/−10%, such as +/−5%, such as +/−2%, such as +/−1%. In another embodiment, the pitch may be about 0.8 mm, such as 0.8 mm+/−10%, such as +/−5%, such as +/−2%, such as +/−1%. In a further embodiment, the pitch may be about 1 mm, such as 1 mm+/−10%, such as +/−5%, such as +/−2%, such as +/−1%.

In a similar manner, the pitch of the external terminals of the coupling capacitors 408 may also be the same as that of the ball grid array 404. For instance, the external terminals may be provided to make contacts as typically employed by a ball-grid array, in particular a surrounding ball-grid array. In this regard, the pitch of the external terminals may be the same as the pitch of a surrounding ball-grid array. That is, the pitch may be within 10%, such as within 5%, such as within 2%, such as within 1%, such as within 0.5%, such as within 0.1% of the pitch of a surrounding ball-grid array.

In addition, like a ball-grid array, the external terminals may be provided in rows and/or columns. That is, the external terminals may be provided such that they exist in at least one row and at least two columns. For instance, the external terminals may be presented in at least two rows, such as at least three rows, such as at least four rows. In addition, the external terminals may be presented in at least two columns, such as at least three columns, such as at least four columns. The number of rows and columns can be dictated by the number of different sets of alternating dielectric layers and internal electrode layers.

In addition, the ball grid array 412 will have a pitch as mentioned above regarding ball grid array 404. In one embodiment, the pitch of the ball grid array 412 may be less than the pitch of the ball grid array 404 and the external terminals of the coupling capacitors 408. Some common pitches for the ball grid array 412 include 0.1 mm and 0.2 mm.

In addition, the integrated circuit package 402 may also be connected to the circuit board 406 using coupling capacitors 408 as defined herein. In this regard, the internal electrode layers of the coupling capacitors 408 may be positioned such that they are orthogonal to a horizontal plane of the circuit board 406 and integrated circuit package 402. In other words, the internal electrode layers of the coupling capacitors 408 may be positioned such that they are substantially nonparallel with the circuit board 406. For instance, the coupling capacitors 408 may be positioned between the integrated circuit package 402 and the circuit board 406 such that the coupling capacitors 408 are "sandwiched" between the two components. In this regard, the coupling capacitors 408 are directly connected to the integrated circuit package 402 and the circuit board 406. For instance, the coupling capacitors 408 can be physically connected to the circuit board 406 and/or circuit package 402 using any method generally known in the art, such as general soldering techniques.

By employing the coupling capacitor in the aforementioned arrangement, the coupling capacitors 408 may allow for removal of some of the original ball grid array 404. However, the coupling capacitors 408 may still be surrounded by a ball grid array 404 as illustrated in FIG. 2.

Figure 3:
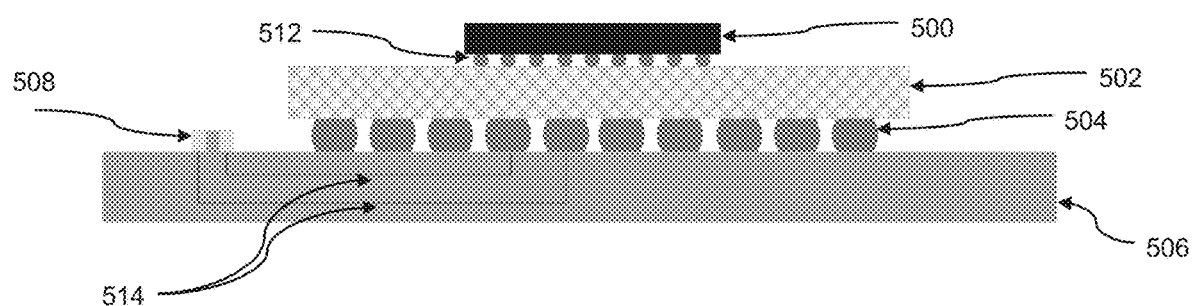
FIG. 3 illustrates a side view of a circuit board and integrated circuit package containing a coupling capacitor of the prior art.

Meanwhile, a prior art circuit board 506 is illustrated in FIG. 3. The circuit board 506 includes a processor 500, an integrated circuit package 502, and ball grid arrays 504 and 512. However, rather than employing a single, unitary capacitor package like coupling capacitors 408 in FIG. 2, the circuit board 506 of FIG. 3 employs an individual multilayer ceramic capacitor 508. In addition, the multilayer ceramic capacitor 508 is positioned elsewhere on the circuit board 506 and is connected to the processor 500 and the integrated circuit package 502 through vias 514.

However, for the reasons mentioned herein, the present configuration employing a single, unitary capacitor can allow for various advantages and benefits in comparison to a circuit board that employs individual multilayer ceramic capacitors.

In general, the coupling capacitors can be employed to allow for an AC signal to pass through or be transmitted while generally blocking a DC signal. That is, it may be employed to block low frequency signals and transmit high frequency signals. In general, the coupling capacitors may have a generally high impedance/resistance at low frequencies that allows for the blocking of the DC signal. In contrast, the coupling capacitors may have a generally low impedance/resistance at high frequencies that allows for the transmission of the AC signal.

One distinct advantage of the coupling capacitors and configuration of the present invention is that when employed within a circuit board as explained herein, the electrical length from the processor to the coupling capacitor is substantially reduced. For instance, as illustrated in FIG. 2, the distance from the processor 400 to the coupling capacitors 408 is substantially less than the distance between the processor 500 and the capacitor 508 in FIG. 3. By placing the coupling capacitors in such a manner, it also allows for elimination of the vias 514 as illustrated in FIG. 3. In addition, by placing the capacitors in such manner, the capacitor can be within an equalizer window, which is desired to be as low as possible. In this regard, by allowing for the capacitor to be within the window, it can allow for the signal to be cleaned up for transmission.

In addition, another distinct advantage of the coupling capacitors and configuration of the present invention is the ability to tailor the capacitor in order to obtain an impedance differential of close to 100Ω as possible. In this regard, the impedance differential may be ±25%, such as ±15%, such as ±10%, such as ±5%, such as ±2%, such as ±1%, such as ±0.5% of 100Ω. It should be understood that the aforementioned 100Ω impedance differential is simply one embodiment of the present invention and that the coupling capacitors can be configured to obtain any desired impedance differential. Such impedance differential can be calculated using any method generally known in the art.

Further, another distinct advantage of the coupling capacitors and configuration of the present invention is the ability to minimize the insertion loss. Such minimal insertion loss may be attributed to the ability to minimize the impedance differential. In this regard, the insertion loss may be 0.5 dB or less, such as 0.25 dB or less, such as 0.15 dB or less, such as 0.1 dB or less, such as 0.05 dB or less. Such insertion loss can be calculated using any method generally known in the art.

In addition the capacitance values may not necessarily be limited. For instance, the capacitance of the coupling capacitors may be in the picoFarad or nanoFarad range. In particular, the capacitance may be 1,000 µF or less, such as 750 µF or less, such as 500 µF or less, such as 250 µF or less, such as 100 µF or less, such as 50 µF or less, such as 25 µF or less, such as 10 µF or less, such as 5 µF or less, such as 2.5 µF or less, such as 1 µF or less, such as 750 nanoFarad or less, such as 500 nanoFarad or less, such as 250 nanoFarad or less, such as 100 nanoFarad or less. The capacitance may be 1 picoFarad or more, such as 10 picoFarad or more, such as 25 picoFarad or more, such as 50 picoFarad or more, such as 100 picoFarad or more, such as 250 picoFarad or more, such as 500 picoFarad or more, such as 750 picoFarad or more, such as 1 nanoFarad or more, such as 10 nanoFarad or more. The capacitance may be measured using general techniques as known in the art.

Furthermore, the resistance of the capacitor may not be necessarily limited. For instance, the resistance of the coupling capacitors may be 100 mOhm or less, such as 75 mOhm or less, such as 50 mOhm or less, such as 40 mOhm or less, such as 30 mOhm or less, such as 25 mOhm or less, such as 20 mOhm or less, such as 15 mOhm or less, such as 10 mOhm or less, such as 5 mOhm or less. The resistance may be 0.01 mOhm or more, such as 0.1 mOhm or more, such as 0.25 mOhm or more, such as 0.5 mOhm or more, such as 1 mOhm or more, such as 1.5 mOhm or more, such as 2 mOhm or more, such as 5 mOhm or more, such as 10 mOhm or more. The resistance may be measured using general techniques as known in the art.

Additionally, the inductance of the capacitor may not be necessarily limited. For instance, the inductance of the coupling capacitors may be less than 1 nanohenry. In particular, the inductance may be 900 picohenries or less, such as 750 picohenries or less, such as 500 picohenries or less, such as 400 picohenries or less, such as 250 picohenries or less, such as 100 picohenries or less, such as 50 picohenries or less, such as 25 picohenries or less, such as 15 picohenries or less, such as 10 picohenries or less. The inductance may be 1 femtohenry or more, such as 25 femtohenries or more, such as 50 femtohenries or more, such as 100 femtohenries or more, such as 250 femtohenries or more, such as 500 femtohenries or more, such as 750 femtohenries or more.

The present inventors have discovered that the aforementioned advantages can be obtained by controlling the width of the internal electrode layers. Such control also allows for control of the spacing between the internal electrode layers in the first set and the internal electrode layers in the second set. In this regard, the shape of the internal electrode layers is not necessarily limited by the present invention so long as the specific operational characteristics and properties can be achieved. In one embodiment, the coupling capacitor may have a certain internal electrode layer width to spacing ratio. In general, the spacing is referred to as the spacing "s" as illustrated in FIG. 1C between the lateral edges of the internal electrode layers of the first set and the second set.

As indicated above, the present invention includes a multilayer coupling capacitor that contains a plurality of capacitive elements within a single, unitary package. The capacitor includes a top surface and a bottom surface opposite the top surface. The capacitor also includes at least one side surface that extends between the top surface and the bottom surface. The capacitor may include at least three side surfaces, such as at least four side surfaces. In one embodiment, the capacitor includes at least six total surfaces (e.g., one top, one bottom, four sides). For instance, the capacitor may have a parallelepiped shape, such as a rectangular parallelepiped shape.

In addition, the capacitor may have a desired height. For instance, the height may be 10 microns or more, such as 25 microns or more, such as 50 microns or more, such as 100 microns or more, such as 200 microns or more, such as 250 microns or more, such as 300 microns or more, such as 350 microns or more, such as 500 microns or more, such as 1,000 microns or more, such as 2,000 microns or more. The height may be 5,000 microns or less, such as 4,000 microns or less, such as 2,500 microns or less, such as 2,000 microns or less, such as 1,000 microns or less, such as 750 microns or less, such as 500 microns or less, such as 450 microns or less. When surrounded by a ball grid array, the height of the capacitor may be within 10%, such as within 7%, such as within 5%, such as within 3%, such as within 2%, such as within 1% the height (or diameter) of the balls of the ball grid array. For instance, such height may be the original height prior to any reflow.

In one embodiment, the height of the capacitor may be 10% or more, such as 20% or more, such as 30% or more, such as 40% or more, such as 45% or more of the pitch. The height may be less than 100%, such as 90% or less, such as 80% or less, such as 70% or less, such as 60% or less, such as 55% or less of the pitch.

In general, the multilayer coupling capacitor contains a first set of alternating dielectric layers and internal electrode layers and a second set of alternating dielectric layers and internal electrode layers. The capacitor also includes external terminals electrically connected to the internal electrode layers wherein the external terminals are formed on a top surface of the capacitor and a bottom surface of the capacitor opposing the top surface of the capacitor.

In general, the capacitor includes at least two sets of alternating dielectric layers and internal electrode layers. However, it should be understood that the present invention may include any number of sets of alternating dielectric layers and internal electrode layers and is not necessarily limited. For instance, the capacitor may include at least three, such as at least four sets of alternating dielectric layers and internal electrode layers.

The first set of alternating dielectric layers and internal electrode layers and the second set of alternating dielectric layers and internal electrode layers may form at least part of the main body of the capacitor. By arranging the dielectric layers and the internal electrode layers in a stacked or laminated configuration, the capacitor may be referred to as a multilayer coupling capacitor and in particular a multilayer ceramic capacitor, for instance when the dielectric layers comprise a ceramic.

Each set of alternating dielectric layers and internal electrode layers comprises dielectric layers alternately arranged with internal electrode layers. In particular, the internal electrode layers include first internal electrode layers and second internal electrode layers interleaved in an opposed and spaced apart relation with a dielectric layer located between each internal electrode layer. In this regard, the respective internal electrode layers are distinct and separate internal electrode layers. However, in one embodiment, the dielectric layers that separate the internal electrode layers may not be distinct. For instance, the dielectric layer separating the internal electrode layers of the first set and the internal electrode layers of the second set may be the same such that it extends along the width of the coupling capacitor.

In general, the thickness of the dielectric layers and internal electrode layers is not limited and can be any thickness as desired depending on the performance characteristics. For instance, the thickness of the internal electrode layers can be, but is not limited to, being about 500 nm or greater, such as about 1 µm or greater, such as about 2 µm or greater to about 10 µm or less, such as about 5 µm or less, such as about 4 µm or less, such as about 3 µm or less, such as about 2 µm or less. For instance, the internal electrode layers may have a thickness of from about 1 µm to about 2 µm.

In addition, the present invention is not necessarily limited by the number of internal electrode layers per set of alternating dielectric layers and internal electrode layers or in the entire capacitor. For instance, each set may include 5 or more, such as 10 or more, such as 25 or more, such as 50 or more, such as 100 or more, such as 200 or more, such as 300 or more, such as 500 or more, such as 600 or more, such as 750 or more, such as 1,000 or more internal electrode layers. Each set may have 5,000 or less, such as 4,000 or less, such as 3,000 or less, such as 2,000 or less, such as 1,500 or less, such as 1,000 or less, such as 750 or less, such as 500 or less, such as 400 or less, such as 300 or less, such as 250 or less, such as 200 or less, such as 175 or less, such as 150 or less internal electrode layers. Also, the entire capacitor may include the aforementioned number of electrode layers.

The internal electrode layers have a top edge and a bottom edge opposite the top edge. The internal electrode layers also have two side edges or lateral edges that extend between the top edge and the bottom edge. In one embodiment, the side edges, top edge, and bottom edge define a main body of the internal electrode layers.

In general, in one embodiment, the top edge and the bottom edge may have the same dimension (e.g., length). In another embodiment, the top edge and the bottom edge may have a different dimension (e.g., length). The side edges may have the same dimension (e.g., height). In addition, the height of a side edge of the internal electrode layer as it extends between the top and bottom surfaces of the capacitor may be less than the height of the capacitor. In other words, in one embodiment, the internal electrode layers may form an electrical connection, such as a direct electrical connection wherein the internal electrode layer contacts the external terminal, with only the external terminal on the top surface of the capacitor or the external terminal on the bottom surface of the capacitor.

For instance, each set of alternating dielectric layers and internal electrode layers comprises dielectric layers alternately arranged with internal electrode layers. In particular, the internal electrode layers include first internal electrode layers and second internal electrode layers interleaved in an opposed and spaced apart relation with a dielectric layer located between each internal electrode layer. In one embodiment, the first internal electrode layers electrically contact a first external terminal while the second internal electrode layers electrically contact a second external terminal. For instance, the first internal electrode layers of a respective set may electrically contact the external terminal on the top surface of the capacitor while the second internal electrode layers of the respective set electrically contact the external terminal on the bottom surface of the capacitor.

Each internal electrode of a respective set may be substantially aligned. For instance, in one embodiment, at least one lateral edge of a first internal electrode layer may be substantially aligned with at least one lateral edge of a second internal electrode layer. In another embodiment, the point of electrical contact of at least one lateral edge of a first internal electrode layer with a respective external terminal may be substantially aligned with the point of electrical contact of at least one lateral edge of a second internal electrode layer with the opposite external terminal. In one embodiment, the point of electrical contact of both lateral edges of a first internal electrode layer with a respective external terminal may be substantially aligned with the point of electrical contact of both lateral edges of a second internal electrode layer with the opposite external terminal.

By substantially aligned, it is meant that the side edge or point of contact of a first internal electrode layer is within +/−10%, such as within +/−5%, such as within +/−4%, such as within +/−3%, such as within +/−2%, such as within +/−1%, such as within +/−0.5% of the side edge or point of contact of a second internal electrode layer based on the distance from a side edge of the coupling capacitor.

Generally, the internal electrode layers of one set may not overlap the internal electrode layers of another set. However, generally, the internal electrode layers within a given set may overlap. For instance, such internal electrode layers may at least partially overlap. In one embodiment, the internal electrode layers only partially overlap. As an example, a first internal electrode layer and a second internal electrode layer within a respective set may at least partially overlap. In particular, the top edge of one internal electrode layer overlaps with the bottom edge of another internal electrode layer. In the instance that the first internal electrode layer includes a top edge that contacts an external terminal on a top surface of the capacitor and the second internal electrode layer includes a bottom edge that contacts an external terminal on a bottom surface of the capacitor, the bottom edge of the first internal electrode layer and the top edge of the second internal electrode layer overlap. Furthermore, the overlap of the first internal electrode layers and second internal electrode layers may be at least 10% or more, such as 25% or more, such as 35% or more, such as 50% or more, such as 60% or more, such as 70% or more, such as 80% or more based on the area defined by the lateral edges of the internal electrode layers and the top and bottom surfaces of the capacitor. Alternatively, such percentage may be based on the area of an internal electrode layer.

Similarly, at least two sets of alternating dielectric layers and internal electrode layers are spaced apart in a longitudinal direction (i.e., in a direction that spans across the length of the capacitor and the major surfaces of the internal electrode layers and dielectric layers). For the sake of clarity, the lateral direction (i.e., in a direction that spans across the thicknesses of the internal electrode layers and dielectric layers) is defined as the width of the capacitor that is dictated by the number of layers in the capacitors.

The distance and spacing between the internal electrode layers in a given set or column may be specifically designed to ensure guided formation of terminations. Such distance between internal electrode layers in a given column may be about 10 microns or less, such as about 8 microns or less, such as from about 2 microns to about 8 microns. However, it should be understood that such distance may not necessarily be limited.

Additionally, the distance between adjacent columnar stacks of electrodes may be, while not limited, greater by at least a factor of two than the distance between adjacent internal electrode layers in a given column to ensure that distinct terminations do not run together. In some embodiments, the distance between adjacent columnar stacks of exposed metallization is about four times the distance between adjacent exposed electrode tabs in a particular stack. However, such distance may vary depending on the desired capacitance performance and circuit board configuration.

In addition, as mentioned herein, the external terminals have a certain pitch. In this regard, the respective bottom edges and the respective top edges of the internal electrode layers of the first set and the second set may have the same or similar pitch. In addition, the width of the internal electrode layers, in particular the width at the point of electrical contact, may be the same as the width of the external terminal. In another embodiment, the width of the internal electrode layer, for instance at the point of electrical contact or elsewhere along the lateral dimension, may be less than the width of the external terminal.

In addition, the internal electrode layers may be symmetric and/or symmetrically positioned within the capacitor in a given direction. For instance, the internal electrode layers may be symmetrical about a vertical line (i.e., a line extending from the center of the top edge to the center of the bottom edge of the internal electrode layer) through the center of the main body of the internal electrode layer. In addition, the internal electrodes of the first set and the second set may be symmetrically positioned within the capacitor such that they are symmetrical about a vertical line (i.e., a line extending from the top surface to the bottom surface) through the center of the main body of the capacitor.

The capacitor of the present invention also includes external terminals on the top surface and the bottom surface. In one particular embodiment, the external terminals may not be present on a side surface of the capacitor.

The external terminals include at least one first polarity terminal and at least one second and opposite polarity terminal. The capacitors may include at least one, such as at least two, such as at least four, such as at least six, such as at least eight first polarity terminals and/or second and opposite polarity terminals on a top surface of the capacitor. Additionally, the capacitors may include the aforementioned amounts of terminals on a bottom surface of the capacitor.

The capacitors may include an equal number of first polarity terminals and/or second polarity terminals on the top surface of a capacitor and the bottom surface of a capacitor. The number of first polarity terminals may equal the number of second and opposite polarity terminals on a top surface of a capacitor. The number of first polarity terminals may equal the number of second and opposite polarity terminals on a bottom surface of a capacitor. The total number of terminals present on a top surface of the capacitor may equal to the total number of terminals present on a bottom surface of the capacitor. The total number of first polarity terminals present on a top surface and a bottom surface of the capacitor may equal the total number of second and opposite polarity terminals present on a top surface and a bottom surface of the capacitor.

In general, the polarity terminals located on a top surface and a bottom surface of a capacitor may not be interdigitated. In this regard, corresponding polarity terminals on a top and a bottom surface may not be offset by a terminal position but may instead be positioned directly above or below another polarity terminal on the opposite top or bottom surface. In other words, corresponding polarity terminals that correspond to a particular set of alternating dielectric layers and internal electrode layers may be substantially aligned. By substantially aligned, it is meant that the offset from a side surface of the capacitor of one lateral edge of a polarity terminal on a top surface is within +/−10%, such as within +/−5%, such as within +/−4%, such as within +/−3%, such as within +/−2%, such as within +/−1%, such as within +/−0.5% of the offset from a side edge of a corresponding polarity terminal on a bottom surface. However, in one embodiment, the external terminals may be interdigitated.

Figure 1A:
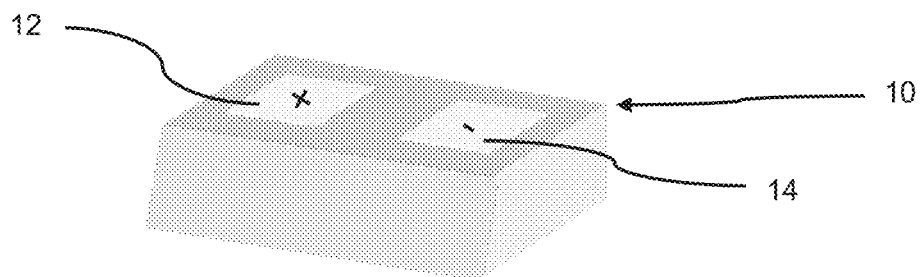
FIG. 1A illustrates a generally top and sides external perspective view of one embodiment of a 1 by 2 package coupling capacitor in accordance with the present invention.
Figure 1B:
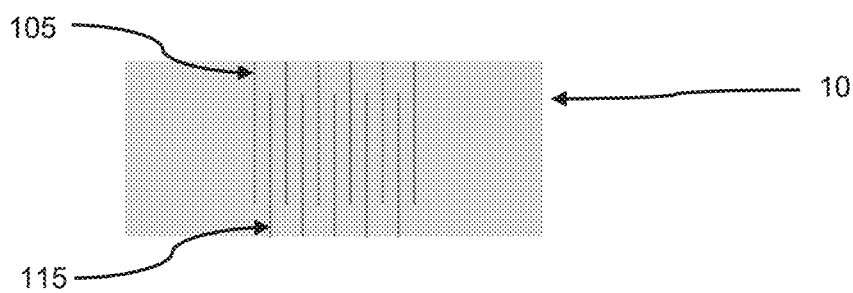
FIG. 1B illustrates a side external perspective view of the coupling capacitor of FIG. 1A.
Figure 1C:
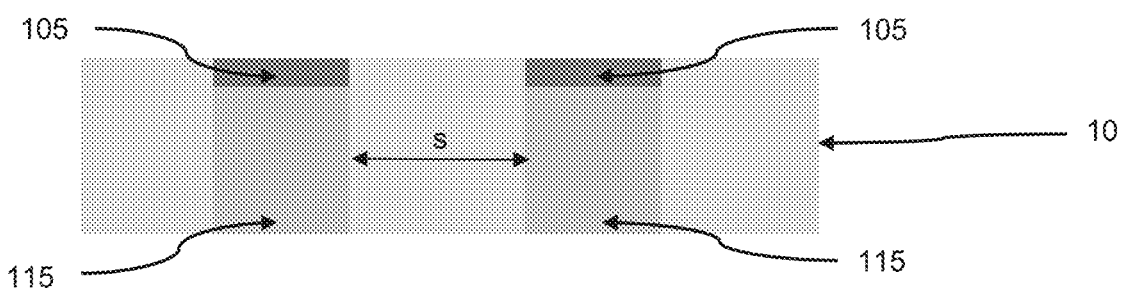
FIG. 1C illustrates a front external perspective view of the coupling capacitor of FIGS. 1A and 1B.

The capacitor of the present invention can be further described according to the embodiments as illustrated in FIGS. 1A-1C.

FIG. 1A illustrates a capacitor 10 in a 2 by 1 configuration. That is, the capacitor includes two terminals along one dimension of the top surface and the bottom surface. In this regard, the capacitor 10 includes a total of two external terminals 12, 14 on a top surface and two corresponding external terminals (not shown) on a bottom surface wherein the external terminals on the top surface correspond to the external terminals on the bottom surface.

The capacitor 10 of FIG. 1A includes external terminals 12, 14 and two sets of alternating dielectric layers and internal electrode layers 110, as illustrated in FIG. 1C. As illustrated in FIGS. 1B and 1C, each set of alternating dielectric layers and internal electrode layers 110 includes internal electrode layers 105, 115 and dielectric layers (not shown) in an alternate arrangement.

In general, the internal electrode layers 105 extend to a top surface of the capacitor and internal electrode layers 115 extend to a bottom surface of the capacitor. The extensions assist in the formation of the external terminals. In this regard, the internal electrode layers may be exposed on the top surface and the bottom surface of the capacitor and allow for connection between the main body of the internal electrode layers and the external terminals. For instance, internal electrode layers 105, 115 extend to an edge of a dielectric layer and allow for formation of the external terminals.

The lateral or sides edges of the internal electrode layers 105, 115 may be aligned in the vertical direction. That is, a lateral edge of a first internal electrode layer 105 may be aligned with a lateral edge of a second internal electrode layer 115. In one embodiment, both lateral edges may be aligned. In another embodiment, the point of contact of a first internal electrode layer 105 with an external terminal may be aligned with the point of contact of a second internal electrode layer 115 with an external terminal.

Additionally, capacitor 10 of FIG. 1A includes at least one first polarity terminal and at least one second and opposite polarity terminal on a top surface. Although not shown, the bottom surface includes at least a first polarity terminal and a second and opposite terminal.

As illustrated in FIGS. 1A-1C, the capacitor contains two external terminals on each surface and two sets of alternating dielectric layers and internal electrode layers. However, as indicated above, the present invention is not limited by the number of external terminals and/or the number of sets of alternating dielectric layers and internal electrode layers. Also, FIG. 1B employs only eleven internal layers per set of alternating dielectric layers and internal electrode layers. However, it should be understood that the present invention may include any number of internal electrode layers per set and is not necessarily limited.

In general, the present invention provides a capacitor having a unique configuration that provides various benefits and advantages. In this regard, it should be understood that the materials employed in constructing the capacitor may not be limited and may be any as generally employed in the art and formed using any method generally employed in the art.

In general, the dielectric layers are typically formed from a material having a relatively high dielectric constant (K), such as from about 10 to about 40,000 in some embodiments from about 50 to about 30,000, and in some embodiments, from about 100 to about 20,000.

In this regard, the dielectric material may be a ceramic. The ceramic may be provided in a variety of forms, such as a wafer (e.g., pre-fired) or a dielectric material that is co-fired within the device itself.

Particular examples of the type of high dielectric material include, for instance, NPO (COG) (up to about 100), X7R (from about 3,000 to about 7,000), X7S, Z5U, and/or Y5V materials. It should be appreciated that the aforementioned materials are described by their industry-accepted definitions, some of which are standard classifications established by the Electronic Industries Alliance (EIA), and as such should be recognized by one of ordinary skill in the art. For instance, such material may include a ceramic. Such materials may include a pervoskite, such as barium titanate and related solid solutions (e.g., barium-strontium titanate, barium calcium titanate, barium zirconate titanate, barium strontium zirconate titanate, barium calcium zirconate titanate, etc.), lead titanate and related solid solutions (e.g., lead zirconate titanate, lead lanthanum zirconate titanate), sodium bismuth titanate, and so forth. In one particular embodiment, for instance, barium strontium titanate ("BSTO") of the formula $Ba_xSr_{1-x}TiO_3$ may be employed, wherein x is from 0 to 1, in some embodiments from about 0.15 to about 0.65, and in some embodiments, from about from 0.25 to about 0.6. Other suitable perovskites may include, for instance, $Ba_xCa_{1-x}TiO_3$ where x is from about 0.2 to about 0.8, and in some embodiments, from about 0.4 to about 0.6, $Pb_xZr_{1-x}TiO_3$ ("PZT") where x ranges from about 0.05 to about 0.4, lead lanthanum zirconium titanate ("PLZT"), lead titanate ($PbTiO_3$), barium calcium zirconium titanate ($BaCaZrTiO_3$), sodium nitrate ($NaNO_3$), $KNbO_3$, $LiNbO_3$, $LiTaO_3$, $PbNb_2O_6$, $PbTa_2O_6$, $KSr(NbO_3)$ and $NaBa_2(NbO_3)_5KHb_2PO_4$. Still additional complex perovskites may include $A[B1_{1/3}B2_{2/3}]O_3$ materials, where A is $Ba_xSr_{1-x}$ (x can be a value from 0 to 1); B1 is $Mg_yZn_{1-y}$ (y can be a value from 0 to 1); B2 is $Ta_zNb_{1-z}$ (z can be a value from 0 to 1). In one particular embodiment, the dielectric layers may comprise a titanate.

The internal electrode layers may be formed from any of a variety of different metals as is known in the art. The internal electrode layers may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. Sputtered titanium/tungsten (Ti/W) alloys, as well as respective sputtered layers of chrome, nickel and gold, may also be suitable. In one particular embodiment, the internal electrode layers may comprise nickel or an alloy thereof.

External terminals may be formed from any of a variety of different metals as is known in the art. The external terminals may be made from a metal, such as a conductive metal. The materials may include precious metals (e.g., silver, gold, palladium, platinum, etc.), base metals (e.g., copper, tin, nickel, chrome, titanium, tungsten, etc.), and so forth, as well as various combinations thereof. In one particular embodiment, the external terminals may comprise copper or an alloy thereof.

The external terminals can be formed using any method generally known in the art. The external terminals may be formed using techniques such as sputtering, painting, printing, electroless plating or fine copper termination (FCT), electroplating, plasma deposition, propellant spray/air brushing, and so forth.

The external terminals may be formed such that the external terminal is a thin-film plating of a metal. Such thin-film plating can be formed by depositing a conductive material, such as a conductive metal, on an exposed portion of an internal electrode layer. For instance, a leading edge of an internal electrode layer may be exposed such that it may allow for the formation of a plated termination.

The external terminals may have an average thickness of about 50 µm or less, such as about 40 µm or less, such as about 30 µm or less, such as about 25 µm or less, such as about 20 µm or less to about 5 µm or more, such as about 10 µm or more, such as about 15 µm or more. For instance, the external terminals may have an average thickness of from about 5 µm to about 50 µm, such as from about 10 µm to about 40 µm, such as from about 15 µm to about 30 µm, such as from about 15 µm to about 25 µm.

In general, the external terminal may comprise a plated terminal. For instance, the external terminal may comprise an electroplated terminal, an electroless plated terminal, or a combination thereof. For instance, an electroplated terminal may be formed via electrolytic plating. An electroless plated terminal may be formed via electroless plating.

When multiple layers constitute the external terminal, the external terminal may include an electroplated terminal and an electroless plated terminal. For instance, electroless plating may first be employed to deposit an initial layer of material. The plating technique may then be switched to an electrochemical plating system which may allow for a faster buildup of material.

When forming the plated terminals with either plating method, a leading edge of the internal electrode layers that is exposed from the main body of the capacitor is subjected to a plating solution. By subjecting, in one embodiment, the capacitor may be dipped into the plating solution.

The plating solution contains a conductive material, such as a conductive metal, is employed to form the plated termination. Such conductive material may be any of the aforementioned materials or any as generally known in the art. For instance, the plating solution may be a nickel sulfamate bath solution or other nickel solution such that the plated layer and external terminal comprise nickel. Alternatively, the plating solution may be a copper acid bath or other suitable copper solution such that the plated layer and external terminal comprise copper.

Additionally, it should be understood that the plating solution may comprise other additives as generally known in the art. For instance, the additives may include other organic additives and media that can assist in the plating process. Additionally, additives may be employed in order to employ the plating solution at a desired pH. In one embodiment, resistance-reducing additives may be employed in the solutions to assist with complete plating coverage and bonding of the plating materials to the capacitor and exposed leading edges of the internal electrode layers.

The capacitor may be exposed, submersed, or dipped in the plating solution for a predetermined amount of time. Such exposure time is not necessarily limited but may be for a sufficient amount of time to allow for enough plating material to deposit in order to form the plated terminal. In this regard, the time should be sufficient for allowing the formation of a continuous connection among the desired exposed, adjacent leading edges of the internal electrode layers of a given polarity of the respective internal electrode layers within a set of alternating dielectric layers and internal electrode layers.

In general, the difference between electrolytic plating and electroless plating is that electrolytic plating employs an electrical bias, such as by using an external power supply. The electrolytic plating solution may be subjected typically to a high current density range, for example, ten to fifteen amp/ft$^2$ (rated at 9.4 volts). A connection may be formed with a negative connection to the capacitor requiring formation of the plated terminals and a positive connection to a solid material (e.g., Cu in Cu plating solution) in the same plating solution. That is, the capacitor is biased to a polarity opposite that of the plating solution. Using such method, the conductive material of the plating solution is attracted to the metal of the exposed leading edge of the internal electrode layers.

Prior to submersing or subjecting the capacitor to a plating solution, various pretreatment steps may be employed. Such steps may be conducted for a variety of purposes, including to catalyze, to accelerate, and/or to improve the adhesion of the plating materials to the leading edges of the internal electrode layers.

Additionally, prior to plating or any other pretreatment steps, an initial cleaning step may be employed. Such step may be employed to remove any oxide buildup that forms on the exposed edges of the internal electrode layers. This cleaning step may be particularly helpful to assist in removing any buildup of nickel oxide when the internal electrodes or other conductive elements are formed of nickel. Component cleaning may be effected by full immersion in a preclean bath, such as one including an acid cleaner. In one embodiment, exposure may be for a predetermined time, such as on the order of about 10 minutes. Cleaning may also alternatively be effected by chemical polishing or harperizing steps.

In addition, a step to activate the exposed metallic leading edges of the internal electrode layers may be performed to facilitate depositing of the conductive materials. Activation can be achieved by immersion in palladium salts, photo patterned palladium organometallic precursors (via mask or laser), screen printed or ink-jet deposited palladium compounds or electrophoretic palladium deposition. It should be appreciated that palladium-based activation is presently disclosed merely as an example of activation solutions that often work well with activation for exposed tab portions formed of nickel or an alloy thereof. However, it should be understood that other activation solutions may also be utilized.

Also, in lieu of or in addition to the aforementioned activation step, the activation dopant may be introduced into the conductive material when forming the internal electrode layers of the capacitor. For instance, when the internal electrode layer comprises nickel and the activation dopant comprises palladium, the palladium dopant may be introduced into the nickel ink or composition that forms the internal electrode layers. Doing so may eliminate the palladium activation step. It should be further appreciated that some of the above activation methods, such as organometallic precursors, also lend themselves to co-deposition of glass formers for increased adhesion to the generally ceramic body of the capacitor. When activation steps are taken as described above, traces of the activator material may often remain at the exposed conductive portions before and after termination plating.

Additionally, post-treatment steps after plating may also be employed. Such steps may be conducted for a variety of purposes, including enhancing and/or improving adhesion of the materials. For instance, a heating (or annealing) step may be employed after performing the plating step. Such heating may be conducted via baking, laser subjection, UV exposure, microwave exposure, arc welding, etc.

As indicated herein, the external terminal comprises at least one plating layer. In one embodiment, the external terminal may comprise only one plating layer. However, it should be understood that the external terminals may comprise a plurality of plating layers. For instance, the external terminals may comprise a first plating layer and a second plating layer. In addition, the external terminals may also comprise a third plating layer. The materials of these plating layers may be any of the aforementioned and as generally known in the art.

For instance, one plating layer, such as a first plating layer, may comprise copper or an alloy thereof. Another plating layer, such as a second plating layer, may comprise nickel or an alloy thereof. Another plating layer, such as a third plating layer, may comprise tin, lead, gold, or a combination, such as an alloy. Alternatively, an initial plating layer may include nickel, following by plating layers of tin or gold. In another embodiment, an initial plating layer of copper may be formed and then a nickel layer.

In one embodiment, initial or first plating layer may be a conductive metal (e.g., copper). This area may then be covered with a second layer containing a resistor-polymeric material for sealing. The area may then be polished to selectively remove resistive polymeric material and then plated again with a third layer containing a conductive, metallic material (e.g., copper).

The aforementioned second layer above the initial plating layer may correspond to a solder barrier layer, for example a nickel-solder barrier layer. In some embodiments, the aforementioned layer may be formed by electroplating an additional layer of metal (e.g., nickel) on top of an initial electrolessly or electrolytically plated layer (e.g., plated copper). Other exemplary materials for layer the aforementioned solder barrier layer include nickel-phosphorus, gold, and silver. A third layer on the aforementioned solder-barrier layer may in some embodiments correspond to a conductive layer, such as plated Ni, Ni/Cr, Ag, Pd, Sn, Pb/Sn or other suitable plated solder.

In addition, a layer of metallic plating may be formed followed by an electroplating step to provide a resistive alloy or a higher resistance metal alloy coating, for example, electroless Ni—P alloy over such metallic plating. It should be understood, however, that it is possible to include any metal coating as those of ordinary skill in the art will understand from the complete disclosure herewith.

It should be appreciated that any of the aforementioned steps can occur as a bulk process, such as barrel plating, fluidized bed plating and/or flow-through plating termination processes, all of which are generally known in the art. Such bulk processes enable multiple components to be processed at once, providing an efficient and expeditious termination process. This is a particular advantage relative to conventional termination methods, such as the printing of thick-film terminations that require individual component processing.

As described herein, the formation of the external terminals is generally guided by the position of the exposed leading edges of the internal electrode layers. Such phenomena may be referred to as "self-determining" because the formation of the external plated terminals is determined by the configuration of the exposed conductive metal of the internal electrode layers at the selected peripheral locations on the capacitor.

Additional aspects of the above-described technology for forming thin-film plated terminations are described in U.S. Pat. No. 7,177,137 to Ritter et al. and U.S. Pat. No. 7,463,474 to Ritter et al., which are incorporated by reference herein for all purposes. It should be appreciated that additional technologies for forming capacitor terminals may also be within the scope of the present technology. Exemplary alternatives include, but are not limited to, formation of terminations by plating, magnetism, masking, electrophoretics/electrostatics, sputtering, vacuum deposition, printing or other techniques for forming both thick-film or thin-film conductive layers.

The coupling capacitors of the present invention can be employed in many applications. For instance, they can be employed in in various applications that require a high speed interface (e.g., high speed differential interface). These applications may include those that employ a SerDes (i.e., Serializer/Deserializer) function or architecture. These may also include those applications that employ a PCIE (i.e., PCI Express) and/or QPI (i.e., QuickPath Interconnect) function or architecture. These applications can include various communications devices. For instance, they can include Ethernet systems, such as Gigabit Ethernet systems, wireless network routers, fiber optic communications systems, and storage devices.

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

The invention claimed is:

1. A surface mount multilayer coupling capacitor comprising:
  a main body containing a first set of alternating dielectric layers and internal electrode layers and a second set of alternating dielectric layers and internal electrode layers,
    each set of alternating dielectric layers and internal electrode layers containing a first internal electrode layer and a second internal electrode layer wherein the first set is spaced apart from the second set in a longitudinal direction and wherein a major surface of the internal electrode layers is in a longitudinal direction,
    each internal electrode layer including a top edge, a bottom edge opposite the top edge, and two side edges extending between the top edge and the bottom edge that define a main body of the internal electrode layer,
  external terminals electrically connected to the internal electrode layers wherein the external terminals are formed only on a top surface of the coupling capacitor and a bottom surface of the coupling capacitor opposing the top surface of the coupling capacitor, wherein the first internal electrode layers of the first set and the second set connect to the external terminals on the top surface and the second electrode layers of the first set and the second set connect to the external terminals on the bottom surface.

2. The multilayer coupling capacitor according to claim 1, wherein the capacitor provides an impedance differential of 100 Ω±10%.

3. The multilayer coupling capacitor according to claim 1, wherein the capacitor exhibits an insertion loss of 0.25 dB or less.

4. The multilayer coupling capacitor according to claim 1, wherein at least one of the first internal electrode layer or the second internal electrode layer electrically contacts the external terminal on the top surface of the coupling capacitor and the other internal electrode layer electrically contacts the external terminal on the bottom surface of the coupling capacitor opposing the top surface of the coupling capacitor.

5. The multilayer coupling capacitor according to claim 1, wherein at least one lateral edge of the first internal electrode layer is substantially aligned with at least one lateral edge of the second internal electrode layer.

6. The multilayer coupling capacitor according to claim 1, wherein both lateral edges of the first internal electrode layer are substantially aligned with both lateral edges of the second internal electrode layer.

7. The multilayer coupling capacitor according to claim 1, wherein the dielectric layers comprise a ceramic.

8. The multilayer coupling capacitor according to claim 7, wherein the ceramic comprises a titanate.

9. The multilayer coupling capacitor according to claim 1, wherein the internal electrode layers comprise a conductive metal.

10. The multilayer coupling capacitor according to claim 9, wherein the conductive metal comprises nickel or an alloy thereof.

11. The multilayer coupling capacitor according to claim 1, wherein the external terminals are electroplated layers.

12. The multilayer coupling capacitor according to claim 1, wherein the external terminals are electroless plated layers.

13. The multilayer coupling capacitor according to claim 1, wherein the external terminals comprise a conductive metal.

14. The multilayer coupling capacitor according to claim 13, wherein the conductive metal comprises silver, gold, palladium, platinum, tin, nickel, chrome, titanium, tungsten, or combinations or alloys thereof.

15. The multilayer coupling capacitor according to claim 13, wherein the conductive metal comprises copper or an alloy thereof.

16. The multilayer coupling capacitor according to claim 1, wherein a pitch of the external terminals is from about 0.1 mm to about 2 mm.

17. A circuit board containing the coupling capacitor of claim 1.

18. A communications device containing the coupling capacitor of claim 1.

19. The communications device of claim 18, wherein the communications device includes an Ethernet system, a wireless network router, a fiber optic communications system, or a storage device.

20. A surface mount multilayer coupling capacitor comprising:
   a main body containing a first set of alternating dielectric layers and internal electrode layers and a second set of alternating dielectric layers and internal electrode layers,
      each set of alternating dielectric layers and internal electrode layers containing a first internal electrode layer and a second internal electrode layer wherein the first set is spaced apart from the second set in a longitudinal direction and wherein a major surface of the internal electrode layers is in a longitudinal direction,
      each internal electrode layer including a top edge, a bottom edge opposite the top edge, and two side edges extending between the top edge and the bottom edge that define a main body of the internal electrode layer,
   external terminals electrically connected to the internal electrode layers wherein the external terminals are formed on a top surface of the coupling capacitor and a bottom surface of the coupling capacitor opposing the top surface of the coupling capacitor, wherein the first internal electrode layers of the first set and the second set connect to the external terminals on the top surface and the second electrode layers of the first set and the second set connect to the external terminals on the bottom surface.

* * * * *